(12) United States Patent
Yeduru et al.

(10) Patent No.: US 12,051,661 B2
(45) Date of Patent: Jul. 30, 2024

(54) OXIDATION AND CORROSION PREVENTION IN SEMICONDUCTOR DEVICES AND SEMICONDUCTOR DEVICE ASSEMBLIES

(71) Applicant: SEMICONDUCTOR COMPONENTS INDUSTRIES, LLC, Phoenix, AZ (US)

(72) Inventors: Srinivasa Reddy Yeduru, Fishkill, NY (US); George Chang, Tempe, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 83 days.

(21) Appl. No.: 17/658,232

(22) Filed: Apr. 6, 2022

(65) Prior Publication Data

US 2022/0328434 A1    Oct. 13, 2022

Related U.S. Application Data

(60) Provisional application No. 63/174,422, filed on Apr. 13, 2021.

(51) Int. Cl.
*H01L 23/00* (2006.01)

(52) U.S. Cl.
CPC .............. *H01L 24/05* (2013.01); *H01L 24/03* (2013.01); *H01L 24/37* (2013.01); *H01L 24/45* (2013.01);

(Continued)

(58) Field of Classification Search
CPC ......... H01L 24/05; H01L 24/03; H01L 24/37; H01L 24/45; H01L 2224/035;
(Continued)

(56) References Cited

U.S. PATENT DOCUMENTS

| 4,857,484 A | 8/1989 | Nishikawa | |
| 6,373,137 B1 * | 4/2002 | McTeer | H01L 21/76867 |
| | | | 257/E23.021 |

(Continued)

FOREIGN PATENT DOCUMENTS

| JP | S63100739 A | 5/1988 |
| JP | 2019525381 A | 9/2019 |
| KR | 20150086165 A | 7/2015 |

OTHER PUBLICATIONS

Svendsen, Leo G. et al., "Corrosion Inhibition by Ion Implantation of Al or Mg in Cu, Investigated by RBS," Nuclear Instruments and Methods 191, 1981.

*Primary Examiner* — Douglas W Owens
(74) *Attorney, Agent, or Firm* — Brake Hughes Bellermann LLP

(57) ABSTRACT

In some aspects, the techniques described herein relate to an electronic device including: a substrate; a metallization layer, the metallization layer having: a first surface disposed on the substrate; a second surface opposite the first surface; and a corrosion-prevention implant layer disposed in the metallization layer, the corrosion-prevention implant layer extending from the second surface to a depth from the second surface in the metallization layer, the depth being less than a thickness of the metallization layer; and an electrical connector coupled with the second surface.

17 Claims, 3 Drawing Sheets

(52) U.S. Cl.
CPC .................. *H01L 2224/035* (2013.01); *H01L 2224/05582* (2013.01); *H01L 2224/05624* (2013.01); *H01L 2224/05639* (2013.01); *H01L 2224/05647* (2013.01); *H01L 2224/05655* (2013.01); *H01L 2224/05666* (2013.01); *H01L 2924/365* (2013.01)

(58) Field of Classification Search
CPC . H01L 2224/05582; H01L 2224/05624; H01L 2224/05639; H01L 2224/05647; H01L 2224/05655; H01L 2224/05666; H01L 2924/365; H01L 24/13; H01L 24/40; H01L 24/48; H01L 2224/02166; H01L 2224/0219; H01L 2224/0382; H01L 2224/0401; H01L 2224/04034; H01L 2224/04042; H01L 2224/05124; H01L 2224/05155; H01L 2224/05166; H01L 2224/05559; H01L 2224/05572; H01L 2224/131; H01L 2224/48465
See application file for complete search history.

(56) References Cited

U.S. PATENT DOCUMENTS

| | | | |
|---|---|---|---|
| 6,376,370 B1 | 4/2002 | Farrar | |
| 9,780,051 B2 * | 10/2017 | Tran | ........................ H01L 24/03 |
| 2005/0070086 A1 | 3/2005 | Isono | |
| 2006/0084256 A1 * | 4/2006 | Cabral | .............. H01L 21/76867 |
| | | | 438/597 |
| 2012/0256279 A1 * | 10/2012 | Wu | .................. H01L 29/66795 |
| | | | 257/E21.409 |

* cited by examiner

OXIDATION AND CORROSION PREVENTION IN SEMICONDUCTOR DEVICES AND SEMICONDUCTOR DEVICE ASSEMBLIES

CROSS-REFERENCE TO RELATED APPLICATION

This application claims priority to and the benefit of U.S. Provisional Application No. 63/174,422, filed Apr. 13, 2021, entitled "SEMICONDUCTOR DEVICES AND METHODS", which is hereby incorporated by reference in its entirety.

TECHNICAL FIELD

This description relates to semiconductor devices and related assemblies. More specifically, this description relates to preventing metallization oxidation in semiconductor devices and/or semiconductor assemblies.

BACKGROUND

Semiconductor devices, which can be included in packages and/or module assemblies, can include metallization layers that are formed during semiconductor processing. Such metallization layers can be used within a semiconductor device to route supply power busses and to form signal traces, which can be referred to as wires, to conduct signals for operation of circuitry included in the semiconductor device (e.g., active circuitry). At least some portions of these metallization layers can be disposed within, and protected by other layers (e.g., thin films) of the semiconductor device, such as dielectric layers and/or passivation layers. These dielectric and/or passivation layers can electrically isolate different metallization layers, or portions of metallization layers from each other, as well as from other elements of the circuitry of the semiconductor device.

Other portions of such metallization layers are used for making electrical connections external to the semiconductor device and, as such, are typically exposed (e.g., to an ambient environment through a passivation layer) to facilitate establishing such electrical connections. Similarly, apparatus used for producing semiconductor device assemblies, such as direct-bonded-metal substrates, can also include exposed metallization layers, which can be used for defining, e.g., electrical connections to an associated semiconductor device. These exposed metallization layers, or exposed portions of metallization layers, can be subject to corrosion (e.g., oxidation or otherwise) as a result of exposure to an ambient environment (e.g., air), and such corrosion can inhibit formation of low resistance electrical connections to the exposed metallization.

Various approaches have been implemented to prevent and/or remove such corrosion, including deposition of protective layers and/or performing cleaning operations. For instance, some current approaches include forming a thin protective layer on the exposed metallization, such as a polymer monolayer or a thin metal-oxide layer (deposited using atomic-layer deposition). Some current approaches also include performing a cleaning process, such as a plasma cleaning process, to remove corrosion and/or remove an applied protective layer just prior to forming electrical connections. These approaches, however, have certain drawbacks such as complexity, cost, and integration with other manufacturing operations, as well as potentially causing cross contamination and/or reducing electrical connection quality (e.g., increasing electrical resistance, reducing wire bond quality, etc.) if not completely removed or broken through to the underlying metallization.

SUMMARY

In some aspects, the techniques described herein relate to an electronic device including: a substrate; a metallization layer, the metallization layer having: a first surface disposed on the substrate; a second surface opposite the first surface; and a corrosion-prevention implant layer disposed in the metallization layer, the corrosion-prevention implant layer extending from the second surface to a depth from the second surface in the metallization layer, the depth being less than a thickness of the metallization layer; and an electrical connector coupled with the second surface.

In some aspects, the techniques described herein relate to an electronic device, wherein the substrate includes a semiconductor device.

In some aspects, the techniques described herein relate to an electronic device, wherein: the substrate includes a ceramic substrate; and the metallization layer is direct-bonded to the ceramic substrate.

In some aspects, the techniques described herein relate to an electronic device, wherein the metallization layer includes a copper metallization layer.

In some aspects, the techniques described herein relate to an electronic device, wherein the metallization layer includes one of an aluminum metallization layer, an aluminum-copper metallization layer, a titanium-nickel-copper metallization layer, or a titanium-nickel-silver metallization layer.

In some aspects, the techniques described herein relate to an electronic device, wherein the corrosion-prevention implant layer includes one of an aluminum implant layer, a magnesium implant layer, or a nitrogen implant layer.

In some aspects, the techniques described herein relate to an electronic device, wherein the electrical connector includes one of a conductive clip, or a bond wire.

In some aspects, the techniques described herein relate to an electronic device, wherein: the thickness of the metallization layer is greater than or equal to 2 micrometers; and the depth of the corrosion-prevention implant layer is less than or equal to 100 nanometers.

In some aspects, the techniques described herein relate to an electronic device, wherein the depth of the corrosion-prevention implant layer is less than or equal to ten percent of the thickness of the metallization layer.

In some aspects, the techniques described herein relate to an electronic device, wherein the corrosion-prevention implant layer is: disposed in a first portion of the metallization layer that is coupled with the electrical connector; and excluded from a second portion of the metallization layer, the second portion being different than the first portion.

In some aspects, the techniques described herein relate to a semiconductor device including: a semiconductor substrate; a metallization layer disposed on the semiconductor substrate; a passivation layer including an opening, the opening exposing a surface of a portion of the metallization layer; a corrosion-prevention implant layer disposed in the portion of the metallization layer, the corrosion-prevention implant layer extending from the exposed surface to a depth from the exposed surface in the metallization layer, the depth being less than a thickness of the metallization layer; and an electrical connector coupled with the exposed surface.

In some aspects, the techniques described herein relate to a semiconductor device, wherein the metallization layer includes a copper metallization layer.

In some aspects, the techniques described herein relate to a semiconductor device, wherein the metallization layer includes one of an aluminum metallization layer, an aluminum-copper metallization layer, or a titanium-nickel-silver metallization layer.

In some aspects, the techniques described herein relate to a semiconductor device, wherein the corrosion-prevention implant layer includes one of an aluminum implant layer, a magnesium implant layer, or a nitrogen implant layer.

In some aspects, the techniques described herein relate to a semiconductor device, wherein the electrical connector includes one of a conductive clip, or a bond wire.

In some aspects, the techniques described herein relate to a semiconductor device, wherein: the thickness of the metallization layer is greater than or equal to 2 micrometers; and the depth of the corrosion-prevention implant layer is less than or equal to 100 nanometers.

In some aspects, the techniques described herein relate to a semiconductor device, wherein the depth of the corrosion-prevention implant layer is less than or equal to ten percent of the thickness of the metallization layer.

In some aspects, the techniques described herein relate to a method for producing an electronic device, the method including: forming a metallization layer on a substrate, the metallization layer having: a first surface disposed on the substrate; and a second surface opposite the first surface; forming a corrosion-prevention implant layer in the metallization layer, the corrosion-prevention implant layer extending from the second surface to a depth from the second surface in the metallization layer, the depth being less than a thickness of the metallization layer; and coupling an electrical connector with the second surface.

In some aspects, the techniques described herein relate to a method, wherein the corrosion-prevention implant layer includes one of an aluminum implant layer, a magnesium implant layer, or a nitrogen implant layer.

In some aspects, the techniques described herein relate to a method, wherein the electrical connector includes one of a conductive clip, or a bond wire.

Figure 1:
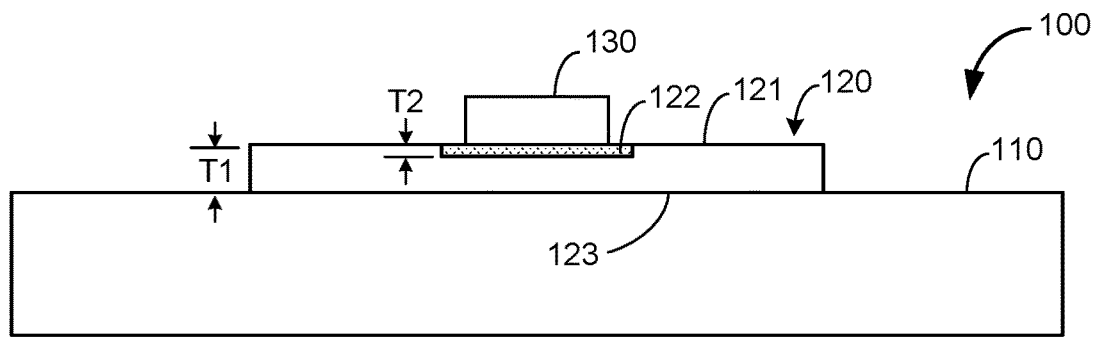
FIG. 1 is a block diagram schematically illustrating an apparatus including an example implementation for corrosion prevention.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols show in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of that element are illustrated.

DETAILED DESCRIPTION

This disclosure is directed to approaches preventing corrosion (oxidation, etc.) of metallization, e.g., exposed metallization, in semiconductor devices and/or semiconductor device assemblies, where such corrosion can cause poor electrical interconnection quality, such as due to poor wire bond or conductive clip adhesion. Thus, the approaches described herein facilitate producing electric interconnections for semiconductor devices and/or semiconductor device assemblies with good adhesion quality, and good conductivity (low resistance). The approaches described herein can also overcome at least some of the drawbacks of current approaches. For instance, the disclosed approaches can be less complex, can be easily integrated with existing manufacturing processes, may be lower cost than the current approaches, and can prevent cross-contamination.

In the approaches described herein, a corrosion-prevention implant process can be performed in an upper portion of metallization layers to inhibit corrosion of, or portions, of those metallization layers prior to forming electrical connections using, e.g., wire bonds and/or conductive clips. In some implementations, by way of example, aluminum (Al), magnesium (Mg) and/or nitrogen (N) (e.g., Al, Mg and/or N ions) can be implanted in an upper portions of a metallization layer, such as copper (Cu) metallization, aluminum-copper (AlCu) metallization, titanium-nickel-copper (Ti-NiCu) metallization, or titanium-nickel-silver (TiNiAg) metallization.

While generally described with respective to semiconductor devices, and semiconductor wafer fabrication, the approaches described herein can also be applied in conjunction with other components of semiconductor device assemblies, such as metallization layers included on a substrate, such a direct-bonded metal (DBM) substrate. In some implementations, metallization layers described herein can be referred to as top metallization layers, where additional metallization layers can be included with the top metallization layers in a stack, with dielectric layers and/or passivation layers being disposed between different layers of metallization, such as in a semiconductor device produced with a process that includes forming multiple layers of interconnected patterned metallization.

FIG. 1 is a block diagram schematically illustrating an apparatus 100 including an example implementation for corrosion prevention. As shown in FIG. 1, the apparatus 100 includes a substrate 110, a metallization layer 120 and an electrical connector 130. In some implementations, the substrate 110 can include a semiconductor device, such as a semiconductor die or a semiconductor wafer. For instance, the substrate 110 can include a silicon die (or silicon wafer) having integrated circuitry formed along a side or surface, e.g., an upper side or surface in the view shown in FIG. 1. For purposes of brevity and clarity, specifics of such circuitry are not shown or described herein, and those specifics will depend on the particular implementation. In some implementations, the substrate 110 can include other semiconductor materials In this example, the metallization layer 120 can be a top level metallization layer that is patterned, e.g., using photolithography, where such patterning is appropriate for a given implementation. The metallization layer 120 can have a surface 121, which can be fully exposed, or can be partially exposed, such as through a passivation layer (not shown). In some implementations, the metallization layer 120 can include one or more of Cu, AlCu, TiNiCu, or TiNiAg, though other metals can be used.

In some implementations, the substrate 110 can be a ceramic substrate, such as included in a DBM substrate. For instance, the substrate 110 can include aluminum-oxide, or aluminum-nitride, though other materials can be used. In this example, the metallization layer 120 can be a patterned metallization layer (e.g., Cu layer) that is direct-bonded, e.g., using a sintering process, and can be used for electrical connection to a corresponding semiconductor device, e.g., using the electrical connector 130.

As further shown in FIG. 1, the metallization layer 120, in either of the above example implementations, can have a corrosion-prevention implant 122 that is disposed in the metallization layer 120. In this example, the corrosion-prevention implant 122 is formed through the surface 121 of the metallization layer 120, where a surface 123 (bottom surface) of the metallization layer 120, opposite the surface 121, can be disposed on the substrate 110. In implementations, the corrosion-prevention implant 122 includes one or more materials that inhibit corrosion of the metallic layer 120. The particular materials included in the corrosion-prevention implant 122 can depend, at least in part, on the composition of the metallization layer 120. In some implementations, the corrosion-prevention implant 122 can include Al, Mg and/or N, e.g., implanted as ions. In some implementations, the corrosion-prevention implant 122 can include other substances.

The corrosion-prevention implant 122 can be formed using an ion beam with an energy and ion dose that is appropriate for the particular implementation. For example, the implantation energy and dose can depend on the composition of the metallization layer 120 and/or on a process used to produce the metallization layer 120, e.g., sputtering, plating, etc. As one example, a Cu metallization layer that is formed using sputtering can be implanted with Al ions using an energy in a range of 10 of kiloelectron volts (keV) and 60 keV, and an implant dose in a range of $1 \times 10^{15}$ cm$^{-2}$ to $6 \times 10^{15}$ cm$^{-2}$.

In this example, the corrosion-prevention implant 122 is only formed in a portion of the metallization layer 120 along the surface 121, while other portions of the metallization layer 120 along the surface 121 exclude the corrosion-prevention implant 122. Such an approach could be used for bond pads of a semiconductor device, where the portions of the metallization layer 120 that exclude the corrosion-prevention implant 122 may be covered by passivation that blocks the corrosion-prevention implant 122 during its formation. In other implementations, the corrosion-prevention implant 122 can be formed over the entirety of the surface 121 of the metallization layer 120, such as for metallization of a redistribution layer for a chip-scale package, or for metallization included in a DBM substrate. Such an approach can be referred to as a blanket implant.

As illustrated in FIG. 1, the metallization layer 120 can have a thickness T1, while the corrosion-prevention implant 122 can have a depth T2 in the metallization layer 120 that is measured from the surface 121. In the apparatus 100, the depth T2 is less than the thickness T1. Depending on the specific implementation (e.g., a semiconductor device or a DBM substrate) the thickness T1 can be greater than or equal to 2 microns (µm), while the depth T2 can be less than or equal to 100 nanometers (nm). In some implementations, the thickness T1 can be in a range of 1 to 10 µm and the depth T2 can be in a range of 50 to 100 nm. In some implementations, the depth T2 can be less than or equal to ten percent of the thickness T1.

In the apparatus 100, the electrical connector 130 is disposed on, and electrically coupled with the surface 121 corresponding with the portion of the metallization layer 120 including the corrosion-prevention implant 122. Depending on the particular implementation, the electrical connector 130 can be a wire bond, a conductive clip, a solder ball, and so forth, where the electrical connector 130 can facilitate electrical connection with the metallization layer 120 and/or the substrate 110. In such an arrangement, the corrosion-prevention implant 122, by preventing corrosion (oxidation, or otherwise) of the metallization layer 120, can facilitate a low resistance and mechanically robust connection between the metallization layer 120 and the electrical connector 130, while avoiding drawbacks of current approaches.

Figure 2:
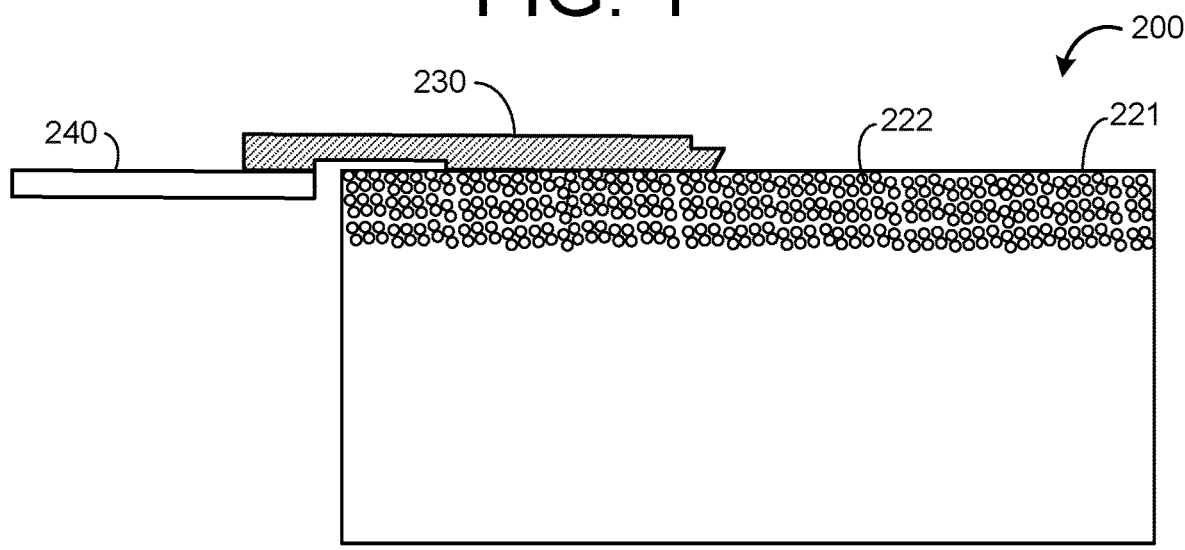
FIG. 2 is a diagram illustrating another apparatus including an example implementation for corrosion prevention.

FIG. 2 is a diagram schematically illustrating another apparatus 200 including an example implementation for corrosion prevention. In some implementations, the apparatus 200 can be implemented in conjunction with the example implementations of the apparatus 100 discussed above. For instance, the apparatus 200 could be included in implementations of the apparatus 100 where the substrate 110 includes a semiconductor device or wafer, or could be included in implementations of the apparatus 100 where the substrate 110 includes a ceramic layer (e.g., of a DBM substrate). As shown in FIG. 2, the apparatus 200 includes a metallization layer 220, and a conductive clip 230 (electrical connector) that electrically couples the metallization layer 220 with a leadframe 240, e.g., of a corresponding semiconductor device assembly. For instance, the conductive clip 230 can be coupled with the metallization layer 220 via solder layer, or other electrically conductive adhesive (not explicitly shown in FIG. 2).

As compared with the corrosion-prevention implant 122 of the apparatus 100, the metallization layer 220 includes a corrosion-prevention implant 222 that is disposed (e.g., using a blanket implant) in the metallization layer 220 along an entirety of a surface 221 (e.g., using a blanket implant). In this example, the corrosion-prevention implant 222 is formed through the surface 221 of the metallization layer 220. As with the corrosion-prevention implant 122, in implementations, the corrosion-prevention implant 222 includes one or more materials that inhibit corrosion of the metallic layer 220. The particular materials included in the corrosion-prevention implant 222 can depend, at least in part, on the composition of the metallization layer 220. For instance, in some implementations, the metallization layer 220 can include one or more of Cu, AlCu, TiNiCu, or TiNiAg, though other metals can be used. In some implementations, the corrosion-prevention implant 222 can include Al, Mg and/or N, e.g., implanted as ions. In some implementations, the corrosion-prevention implant 222 can include other substances.

Also, as with the corrosion-prevention implant 122, the corrosion-prevention implant 222 can be formed using an ion beam with an energy and ion dose that is appropriate for the particular implementation. For example, the implantation energy and dose can depend on the composition of the metallization layer 220 and/or on a process used to produce the metallization layer 220, e.g., sputtering, plating, etc. In some implementations, the metallization layer 220 can have a thickness consistent with the ranges described with respect to the metallization layer 120, and the corrosion-prevention implant 222 can have a depth consistent with ranges described above with respect to the corrosion-prevention implant 122.

Figure 3:
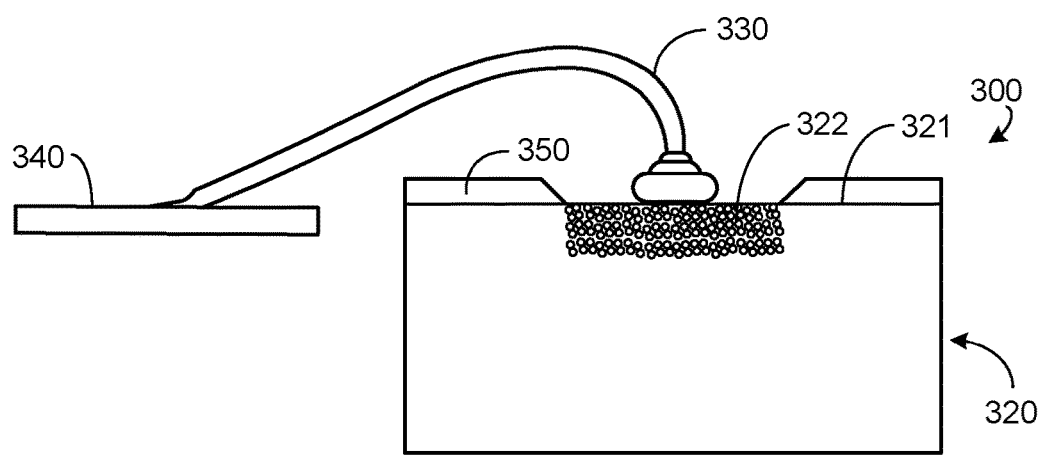
FIG. 3 is a diagram illustrating yet another apparatus including an example implementation for corrosion prevention.

FIG. 3 is a diagram schematically illustrating another apparatus 300 including an example implementation for corrosion prevention. As with the apparatus 200, in some implementations the apparatus 300 can be implemented in conjunction with the example implementations of the apparatus 100 discussed above. For instance, the apparatus 300 could be included in implementations of the apparatus 100 where the substrate 110 includes a semiconductor device or wafer, or could be included in implementations of the apparatus 100 where the substrate 110 includes a ceramic layer (e.g., of a DBM substrate). As shown in FIG. 3, the apparatus 300 includes a metallization layer 320, and a bond wire 330 (electrical connector) that electrically couples the metallization layer 320 with a leadframe 340, e.g., of a corresponding semiconductor device assembly.

The metallization layer 320 includes a corrosion-prevention implant 322 that is disposed in the metallization layer 320 along only a portion of a surface 321 and is excluded from other portions of the metallization layer 320, such as with the corrosion-prevention implant 122 in the metallization layer 120 of FIG. 1. In this example, the corrosion-prevention implant 322 is formed through the surface 321 of the metallization layer 320, e.g., through an opening in a passivation layer 350. As with the corrosion-prevention implant 122 and the corrosion-prevention implant 222, in implementations, the corrosion-prevention implant 322 includes one or more materials that inhibit corrosion of the metallic layer 320. The particular materials included in the corrosion-prevention implant 322 can depend, at least in part, on the composition of the metallization layer 320. For instance, in some implementations, the metallization layer 320 can include one or more of Cu, AlCu, TiNiCu, or TiNiAg, though other metals can be used. In some implementations, the corrosion-prevention implant 322 can include Al, Mg and/or N, e.g., implanted as ions. In some implementations, the corrosion-prevention implant 322 can include other substances.

Also, as with the corrosion-prevention implant 122 and the corrosion-prevention implant 222, the corrosion-prevention implant 322 can be formed using an ion beam with an energy and ion dose that is appropriate for the particular implementation. For example, the implantation energy and dose can depend on the composition of the metallization layer 320 and/or on a process used to produce the metallization layer 320, e.g., sputtering, plating, etc. In some implementations, the metallization layer 320 can have a thickness consistent with the ranges described with respect to the metallization layer 120, and the corrosion-prevention implant 322 can have a depth consistent with ranges described above with respect to the corrosion-prevention implant 122.

Figure 4:
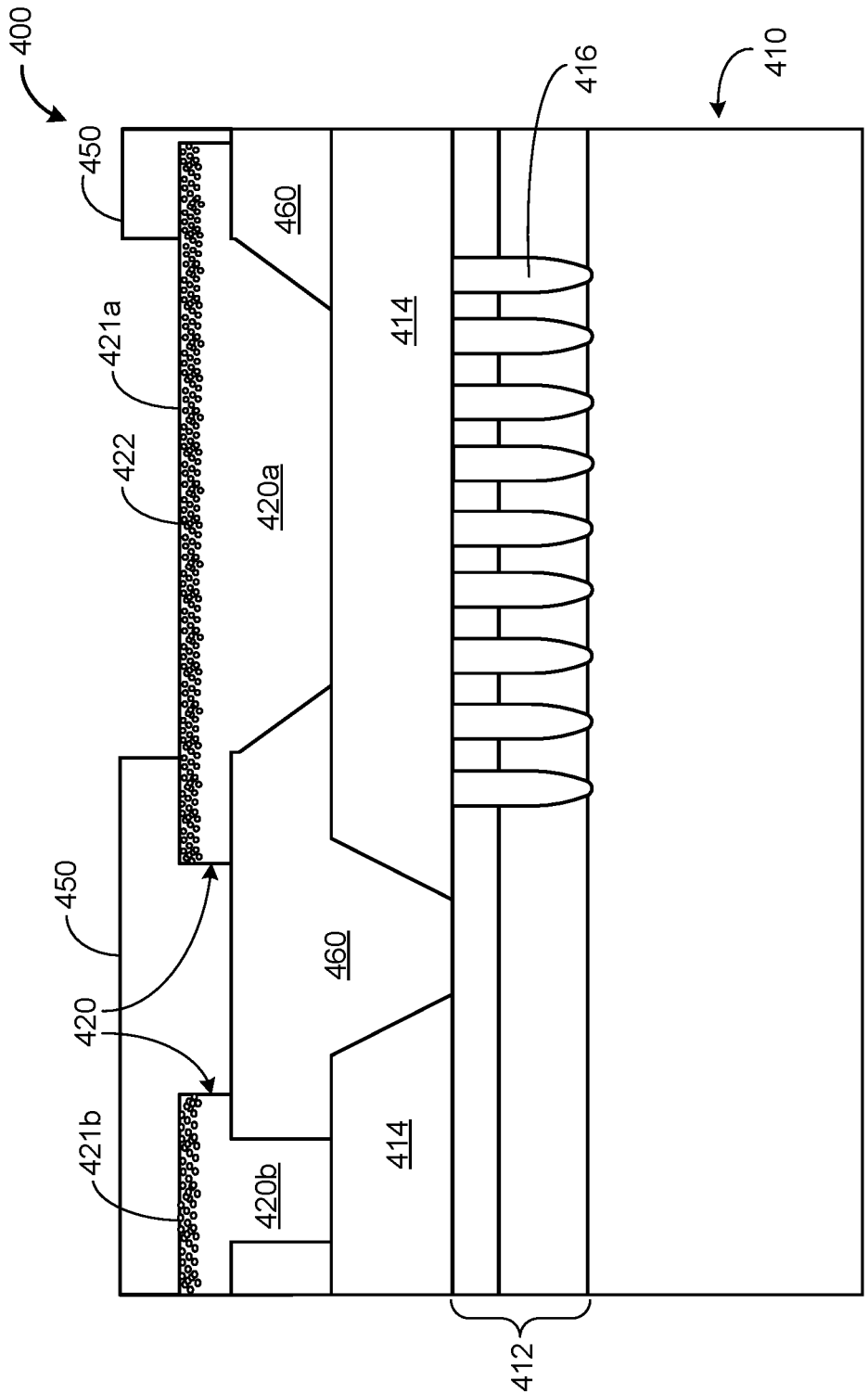
FIG. 4 is a diagram illustrating a semiconductor device including an example implementation for corrosion prevention.

FIG. 4 is a diagram illustrating a semiconductor device 400 including an example implementation for corrosion prevention. The semiconductor device 400 includes a semiconductor substrate 410, e.g., such as a silicon substrate, a silicon-carbide substrate, etc. As schematically shown FIG. 4, the substrate 410 includes an active circuitry layer 412 formed therein and/or thereon. The semiconductor device 400 also includes a metallization layer 414, of which a portion of is electrically coupled with the substrate 410 via contacts 416. The semiconductor device 400 further includes a dielectric layer 460 that, at least, isolates portions of the metallization layer 414 from each other.

As shown in FIG. 4, the semiconductor device 400 further includes a top-level metallization layer 420, which can be a patterned metallization layer that includes a portion 420a and a portion 420b. As with the corrosion-prevention implant 122 of the apparatus 100 and the corrosion-prevention implant 222 of the apparatus 200, the portion 420a and the portion 420b of the top-level metallization layer 420 include a corrosion-prevention implant 422 that is disposed (e.g., using a blanket implant) along an entirety of a surface 421a of the portion 420a, and an entirety of a surface 421b of the portion 420b (e.g., using a blanket implant). In this example, the corrosion-prevention implant 422 is formed through the surface 421a and the surface 421b of the top-level metallization layer 420. The semiconductor device 400 in FIG. 4 further includes a passivation layer 450 that can protect the underlying structure of the semiconductor device 400. The passivation layer 450, as shown in FIG. 4, is patterned (e.g., using photolithography and etch processes) to expose a portion of the surface 421a of the top-level metallization layer 420, which can be used for coupling an electrical connector (not shown) with the semiconductor device 400.

As with the corrosion-prevention implants of FIGS. 1-3, in implementations, the corrosion-prevention implant 422 includes one or more materials that inhibit corrosion of the top-level metallization layer 420. The particular materials included in the corrosion-prevention implant 422 can depend, at least in part, on the composition of the top-level metallization layer. For instance, in some implementations, the top-level metallization layer can include one or more of Cu, AlCu, TiNiCu, or TiNiAg, though other metals can be used. In some implementations, the corrosion-prevention implant 422 can include Al, Mg and/or N, e.g., implanted as ions. In some implementations, the corrosion-prevention implant 422 can include other substances.

Also, as with the corrosion-prevention implants of FIGS. 1-3, the corrosion-prevention implant 422 can be formed using an ion beam with an energy and ion dose that is appropriate for the particular implementation. For example, the implantation energy and dose can depend on the composition of the top-level metallization layer 420 and/or on a process used to produce the top-level metallization layer 420, e.g., sputtering, plating, etc. In some implementations, the top-level metallization layer 420 can have a thickness consistent with the ranges described with respect to the metallization layer 120, and the corrosion-prevention implant 422 can have a depth consistent with ranges described above with respect to the corrosion-prevention implant 122.

Figure 6:
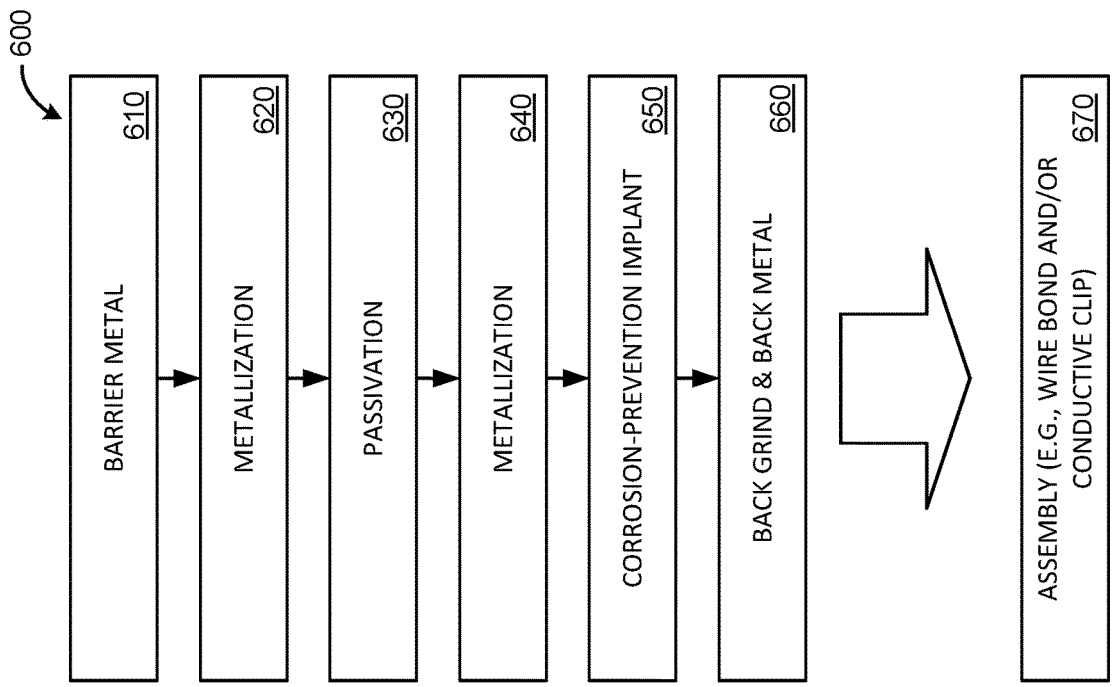
FIG. 6 is another flowchart illustrating semiconductor processing operations, in accordance with an implementation.
Figure 5:
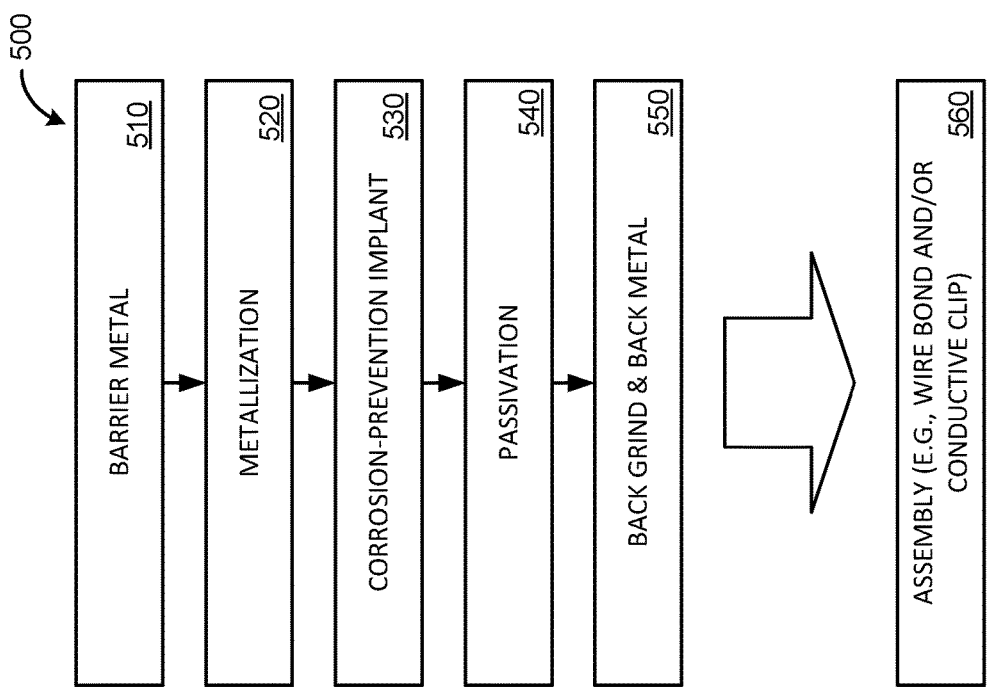
FIG. 5 is a flowchart illustrating semiconductor processing operations, in accordance with an implementation.

FIGS. 5 and 6 are flowcharts illustrating, respectively, methods 500 and 600, which include example semiconductor processing operations that can be used to produce the implementations described herein. The operations shown in FIGS. 5 and 6 are given be way of example and can be implemented in conjunction with other operations of a semiconductor manufacturing process. In some implementations, one or more operations of the approaches shown in FIGS. 5 and 6 can used for producing, e.g., a DBM substrate with a corrosion-prevention implant.

Referring to FIG. 5, the method 500, which can be implemented after performing other semiconductor processing operations (e.g., operations to produce active circuitry), at block 510, includes forming a barrier metal layer and, at block 520, includes forming a metallization layer (e.g., the metallization layer 120, the metallization layer 220, the metallization layer 320, the top-level metallization layer 420, etc.) that is disposed on the barrier metal layer. The barrier metal layer can prevent unwanted interaction (e.g., spiking and/or material migration) between the metallization layer of block 520 and layers of a semiconductor device underlying the barrier metal.

At block 530, the method 500 includes performing a corrosion-prevention implant on the metallization layer of block 520, which can be a blanket implant, such as described herein. At block 540, the method 500 includes forming a passivation layer, such as the passivation layer 450 of FIG. 4. At block 550, the method includes performing a back grind, e.g., to thin a corresponding semiconductor wafer to a desired thickness, and applying a metal layer (back metal) to the ground surface, where the back metal layer facilitates electrical connection with the back side of the semiconductor wafer. The method can then proceed to block 560, where the semiconductor wafer is used for assembling individual semiconductor devices, e.g., by dicing the wafer into individual die for use in respective semiconductor device assemblies. The assembly process at block 560 can include coupling electrical connectors (e.g., bond wires, conductive clips, solder balls, etc.) with exposed portions of the metallization layer of block 520 that include the corrosion-prevention implant of block 530.

Referring to FIG. 6, the method 600, as with the method 500, can be implemented after performing other semiconductor processing operations (e.g., operations to produce active circuitry). At block 610, the method 600 includes forming a barrier metal layer and, at block 620, includes forming a metallization layer (e.g., an underlying metallization layer). At block 630, the method 600 includes forming a passivation layer, such as those described herein, and at block 640 includes forming a metallization layer (e.g., a top level metallization layer). The metallization layer of block 640 can be bond pad metallization, or metallization of a redistribution layer, as two examples.

At block 650, the method 600 includes performing a corrosion-prevention implant on the metallization layer of block 640. At block 660, the method includes performing a back grind and back metal process, such as described with respect to FIG. 5. The method 600 can then proceed to block 670, where the semiconductor wafer is used for assembling individual semiconductor devices, e.g., by dicing the wafer into individual die. The assembly process at block 670 can include coupling electrical connectors (e.g., bond wires, conductive clips, solder balls, etc.) with exposed portions of the metallization layer of block 640 that include the corrosion-prevention implant of block 650.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Silicon Carbide (SiC), Gallium Arsenide (GaAs), Gallium Nitride (GaN), and/or so forth. Some implementations may be implemented using various types of semiconductor assemblies, such as assemblies include substrates including, but not limited to, direct-bonded metal (DBM) substrates.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An electronic device comprising:
   a substrate;
   a metallization layer, the metallization layer having:
      a first surface disposed on the substrate;
      a second surface opposite the first surface; and
      a corrosion-prevention implant layer disposed in the metallization layer, the corrosion-prevention implant layer extending from the second surface to a depth from the second surface in the metallization layer, the depth being less than a thickness of the metallization layer, the corrosion-prevention implant layer including at least one of aluminum or magnesium; and
   an electrical connector coupled with the second surface.

2. The electronic device of claim 1, wherein the substrate includes a semiconductor device.

3. The electronic device of claim 1, wherein:
   the substrate includes a ceramic substrate; and
   the metallization layer is direct-bonded to the ceramic substrate.

4. The electronic device of claim 1, wherein the metallization layer includes a copper metallization layer.

5. The electronic device of claim 1, wherein the metallization layer includes one of an aluminum metallization layer, an aluminum-copper metallization layer, a titanium-nickel-copper metallization layer, or a titanium-nickel-silver metallization layer.

6. The electronic device of claim 1, wherein the electrical connector includes one of a conductive clip, or a bond wire.

7. The electronic device of claim 1, wherein:
the thickness of the metallization layer is greater than or equal to 1 micrometer; and
the depth of the corrosion-prevention implant layer is less than or equal to 100 nanometers.

8. The electronic device of claim 1, wherein the depth of the corrosion-prevention implant layer is less than or equal to ten percent of the thickness of the metallization layer.

9. The electronic device of claim 1, wherein the corrosion-prevention implant layer is:
disposed in a first portion of the metallization layer that is coupled with the electrical connector; and
excluded from a second portion of the metallization layer, the second portion being different than the first portion.

10. A semiconductor device comprising:
a semiconductor substrate;
a top level metallization layer disposed on the semiconductor substrate;
a passivation layer including an opening, the opening exposing a surface of a portion of the top level metallization layer;
a corrosion-prevention implant layer disposed in the portion of the top level metallization layer, the corrosion-prevention implant layer extending from the exposed surface to a depth from the exposed surface in the top level metallization layer, the depth being less than a thickness of the top level metallization layer, the corrosion-prevention implant layer including at least one of aluminum or magnesium; and
an electrical connector coupled with the exposed surface.

11. The semiconductor device of claim 10, wherein the top level metallization layer includes a copper metallization layer.

12. The semiconductor device of claim 10, wherein the top level metallization layer includes one of an aluminum metallization layer, an aluminum-copper metallization layer, or a titanium-nickel-silver metallization layer.

13. The semiconductor device of claim 10, wherein the electrical connector includes one of a conductive clip, or a bond wire.

14. The semiconductor device of claim 10, wherein:
the thickness of the top level metallization layer is greater than or equal to 1 micrometer; and
the depth of the corrosion-prevention implant layer is less than or equal to 100 nanometers.

15. The semiconductor device of claim 10, wherein the depth of the corrosion-prevention implant layer is less than or equal to ten percent of the thickness of the top level metallization layer.

16. A method for producing an electronic device, the method comprising:
forming a metallization layer on a substrate, the metallization layer having:
a first surface disposed on the substrate; and
a second surface opposite the first surface;
forming a corrosion-prevention implant layer in the metallization layer, the corrosion-prevention implant layer extending from the second surface to a depth from the second surface in the metallization layer, the depth being less than a thickness of the metallization layer, the corrosion-prevention implant layer including at least one of aluminum or magnesium; and
coupling an electrical connector with the second surface.

17. The method of claim 16, wherein the electrical connector includes one of a conductive clip, or a bond wire.

* * * * *